United States Patent [19]

Miller et al.

[11] Patent Number: 5,171,415
[45] Date of Patent: Dec. 15, 1992

[54] COOLING METHOD AND APPARATUS FOR MAGNETRON SPUTTERING

[75] Inventors: Kenneth C. Miller, Mountain View; Eliot K. Broadbent, San Jose, both of Calif.

[73] Assignee: Novellus Systems, Inc., San Jose, Calif.

[21] Appl. No.: 631,578

[22] Filed: Dec. 21, 1990

[51] Int. Cl.$^5$ .............................................. C23C 14/35
[52] U.S. Cl. ............................ 204/298.09; 204/298.2
[58] Field of Search ................. 204/298.09, 298.19, 204/298.2, 298.21, 298.22

[56] References Cited

U.S. PATENT DOCUMENTS

| | | | |
|---|---|---|---|
| 3,956,093 | 5/1976 | McLeod | 204/192.12 |
| 4,100,055 | 7/1978 | Rainey | 204/298.12 |
| 4,116,806 | 9/1978 | Love et al. | 204/298.19 |
| 4,162,954 | 7/1979 | Morrison, Jr. | 204/298.19 |
| 4,166,018 | 8/1979 | Chapin | 204/192.12 |
| 4,175,030 | 11/1979 | Love et al. | 204/298.18 |
| 4,312,731 | 1/1982 | Morrison, Jr. | 204/192.12 |
| 4,444,643 | 4/1984 | Garrett | 204/298.2 |
| 4,680,061 | 7/1987 | Lamont, Jr. | 250/398 |
| 4,714,536 | 12/1987 | Freeman et al. | 204/298.2 |
| 4,826,584 | 5/1989 | dos Santos Pereiro Ribeiro | 204/298.09 |

FOREIGN PATENT DOCUMENTS

| | | | |
|---|---|---|---|
| 0213922 | 8/1985 | European Pat. Off. | 204/298.2 |
| 0300995 | 7/1988 | European Pat. Off. | 204/298.22 |
| 3636524 | 10/1986 | Fed. Rep. of Germany | 204/298.22 |
| 59-215484 | 12/1984 | Japan | 204/298.2 |
| 2125440A | 3/1984 | United Kingdom | 204/298.09 |

*Primary Examiner*—Aaron Weisstuch
*Attorney, Agent, or Firm*—Skjerven, Morrill, MacPherson, Franklin & Friel

[57] ABSTRACT

The movable magnet track housing of a magnetron sputtering apparatus is provided with a cooling channel and a plurality of nozzles for cooling the backing plate of the magnetron sputtering target. A cooling liquid is delivered to the cooling channel, which distributes the pressure of the liquid to its nozzles. Fluid dispensed from the nozzles is directed at a given area on the back of the target backing plate to make cooling more efficient. The flattened teardrop shape of the magnet track is suitable for achieving uniform magnetic flux in an annular region when rotated about a predetermined center of rotation. The magnet track is rotated circularly and moved radially during magnetron sputtering to achieve substantially uniform magnetic flux over a major annular region of the target, while suitably eroding the center and perimeter regions of the target.

31 Claims, 9 Drawing Sheets

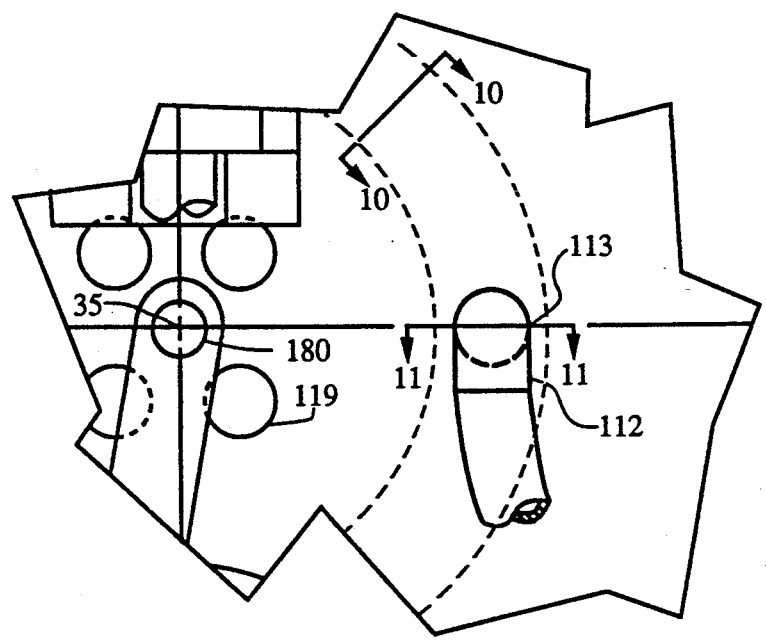
FIGURE 9
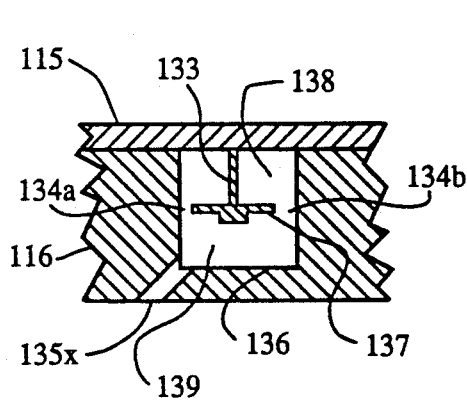
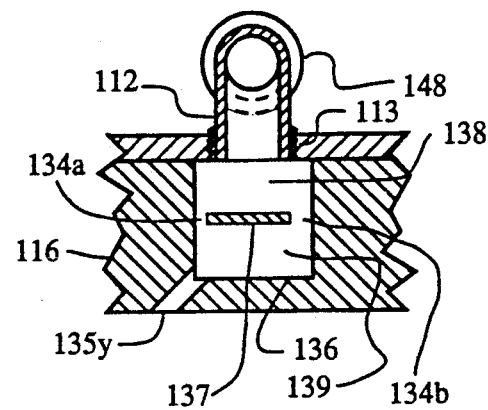
FIGURE 10  FIGURE 11

COOLING METHOD AND APPARATUS FOR MAGNETRON SPUTTERING

BACKGROUND OF THE INVENTION

1. Field of the Invention

The present invention relates to planar magnetron sputtering, and more specifically to a cooling apparatus and method for use in planar magnetron sputtering equipment.

2. Description of Related Art

Sputtering describes a number of physical techniques commonly used in, for example, the semiconductor industry for the deposition of thin films of aluminum and aluminum alloys, refractory metal silicides, gold, copper, titanium-tungsten, tungsten, molybdenum, and less commonly silicon dioxide and silicon on an item, for example a wafer being processed. In general, the techniques involve producing a gas plasma of ionized inert gas "particles" (atoms or molecules) by using an electrical field in an evacuated chamber. The ionized particles are then directed toward a "target" and collide with it. As a result of the collisions, free atoms of the target material are released from the surface of the target, essentially converting the target material to its gas phase. Most of the free atoms which escape the target surface condense and form (deposit) a thin film on the surface of the wafer being processed, which is located a relatively short distance from the target.

One common sputtering technique is magnetron sputtering. When processing wafers using magnetron sputtering, a magnetic field is used to concentrate sputtering action in the region of the magnetic field so that sputtering occurs at a higher rate and at a lower process pressure. The target itself is electrically biased with respect to the wafer and chamber, and functions as a cathode. Objectives in engineering the cathode and its associated magnetic field source include uniform erosion of the target and uniform deposition of pure target material on the wafer being processed.

During sputtering, if magnets generating the magnetic field are stationary at a location, then continuous sputtering consumes the sputtering target thickness at that location quickly and generates hot spots at the locations of sputtering. To avoid contaminating the process, sputtering is stopped before the non-uniform wear pattern has consumed the full thickness of the target material at any point. If any point on the target plate behind the target were to be reached, sputtering of the target plate material (usually copper) would occur, contaminating the vacuum chamber and the wafer being processed with copper. Because of the non-uniform pattern of target utilization, the sputtering must be stopped when a large percentage of the target still remains.

To attempt to increase the target utilization and prolong the target's life, magnets in a magnet housing, have been moved in an oscillatory manner using various techniques in various motions. These techniques result in increasing the target utilization over that provided by stationary magnets, but also result in grooves, racetracks, or other non-uniform wear patterns being formed in the target as the target is consumed. The non-uniform target utilization takes place because the magnets and their associated magnetic field, as they are configured and moved, do not dwell uniformly over the target to be sputtered, resulting in a low percentage target utilization, as well as a non-uniform heat build-up directly associated with the non-uniform target material utilization pattern.

One approach involving the cathode in a fixed magnet magnetron sputtering apparatus is described in U.S. Pat. No. 4,680,061, issued July 14, 1987, to Lamont, Jr., and U.S. Pat. No. 4,100,055, issued July 11, 1978 to Rainey. The target is shaped like a ring, which is said to provide good deposition uniformity without using relative movement between the source and the wafer, as had previously been done.

Another approach involving a magnetic field source in a planar magnetron sputtering apparatus is described in U.S. Pat. No. 4,444,643, issued Apr. 1151 24, 1984, to Garrett. In contrast to fixed magnetron sputtering apparatus, the Garrett apparatus moves a magnetic field source across the non-vacuum side of the target to sweep magnetic flux lines over the target surface. Since maximum erosion of a target occurs where lines of magnetic flux are parallel with the surface of the target, the sweeping is said to avoid the "racetrack" grooves found in prior sputtering devices having fixed magnetic field sources, and thereby provides greater uniformity of target erosion. The magnetic field source of Garrett's apparatus includes a magnet and ring subassembly, the magnetically permeable ring thereof having a plurality of permanent magnets arranged radially inward from the inner circumference of the ring and in paired symmetry. The axial arrangement of the magnets is said to cause the creation of a series of loop pairs of flux in planes normal to the plane of the target and long diameters through the paired magnets.

Another swept field approach is described in U.S. Pat. No. 4,714,536, issued Dec. 22, 1987, to Freeman et al. The magnet assembly of Freeman et al. is rotated about a central axis relative to the target surface and simultaneously rotated about a second axis spaced from the central axis, with the magnet assembly being mounted off-center with respect to the second axis. The resulting pattern is said to be essentially an epicycloid, which is displaced about the axis of rotation with each successive revolution. The particular path traced by the magnet assembly is dependent upon the radii and gear ratios of the driving motor assembly. The magnet assembly itself contains permanent magnets mounted with their north-south axis aligned with radii of the cup-shaped holder, such that the north poles of each of the magnets are adjacent the center of the holder.

Conventional cooling methods in prior art sputtering devices employ a cavity behind or internal to a plate being heated by sputtering; see, e.g., the patents to Lamont, Jr., Rainey, Garrett, and Freeman mentioned above, as well as U.S. Pat. Nos. 3,956,093 issued on May, 11, 1976 to McLeod; 4,116,806 issued on Sep. 26, 1978 to Love et al.; and 4,175,030 issued on Nov. 20, 1979 to Love et al. In these patents, water or other cooling liquid is provided through an opening to fixed internal passages of the device or a cavity of the device. A separate opening allows the water to be discharged from the device. The devices having fixed internal passages route the cooling water through these passages, which are adjacent to the heat generated elements of the device, to cool them. In the devices where the water is routed to a cavity, the direction of the flow of water as well as the movement of a mechanism inside the cavity contribute to the agitation of the cooling liquid as it cools the heat generating elements before the cooling liquid exits the cavity. These prior art methods for cooling devices having internal cavities for cooling sometimes create large and often random differences in actual water flow and in the temperature of a heat generated target plate from one side to the other and across the plate. The water cavity is pressurized as coolant flows. Pressurizing the water cavity in contact with the target plate requires that it be strengthened, because the pressure within the water chamber when added to the vacuum pressure in the evacuated sputtering cavity provides a large differential pressure across the target plate. The target plate must be sized to support this large differential pressure.

While cooling has also been proposed by drilling gun bore type channels in the target backing plate similar to the fixed cooling passages in the prior art, the location of these channels necessarily causes localized hot spots between the channels and in the prior art temperature increases away from the location of cooling liquid flow. Also, drilling, locating, and connecting cooling liquid piping to these channels unnecessarily complicates the construction of the target backing plate.

The distance between the magnets and the surface of the target affects the degree to which sputtering is concentrated by the magnet's magnetic field. For a given magnet design, a short distance causes sputtering to be more highly concentrated than a greater distance. The highest sputtering concentration occurs if a target having a negligible thickness is mounted directly on the magnets. Every additional increment of distance between the surface of the target and the magnets reduces the influence of the magnetic field on sputtering of the target.

A thick target backing plate is necessary in a pressurized water chamber device to attain the additional strength needed to support the pressure behind the target backing plate, and is also necessary in a device using a target backing plate which has been drilled for cooling and therefore requires additional thickness to retain its nominal strength. Unfortunately, the use of a thick target backing plate, which together with the target forms a target plate assembly, adds extra thickness to the target plate assembly. To avoid a change in magnetic flux at the target's surface, a thin target must be substituted to maintain the same distance between the magnets and the target's surface. Alternately, a reduced magnetic flux at the target surface, as a result of increased distance (thickness) between the magnets and the surface of the target, must be accepted. Therefore, the need to increase the thickness of the target backing plate to provide more strength is in conflict with the desire to reduce the distance between the surface of the target and the magnets to concentrate the location of sputtering.

Despite considerable improvement in the engineering of targets and magnetic field sources for planar magnetron sputtering equipment, uniform erosion of the target and uniform deposition of pure target materials on the wafer remain problematic, particularly where sputtered material is deposited on large diameter wafers.

SUMMARY OF THE INVENTION

Effective cooling of a magnetron sputtering apparatus is achieved in the present invention without the need for a target backing plate having sufficient thickness to resist the pressure of a pressurized water cavity or to accommodate internal bore-type channels. In one embodiment of the present invention, a cooling liquid is provided to a cooling channel, and the cooling liquid is dispensed from the cooling channel, to at least one nozzle which directs the flow of the cooling liquid to locations on the back side of the sputtering target assembly. In another embodiment, a cooling apparatus comprises a rotatable drive shaft, inlet means for supporting the drive shaft and for routing a cooling liquid, and an outlet for routing the cooling liquid from the drive shaft to the cooling channel. Nozzles are disposed in the cooling channel for directing streams of fluid toward the backside of the target backing plate. In another embodiment, a plurality of fluid streams are introduced into a general region between a sweep magnet assembly and a target of a magnetron sputtering apparatus, and the fluid is accumulated in a generally unpressurized reservoir behind the target and drained from the reservoir. In another embodiment, a magnet housing unit for sweeping behind the target backing plate of a planar magnetron sputtering apparatus comprises a support body having a surface adapted for sweeping behind the target backing plate, a magnet track disposed in the support body, fluid line and fluid channel provided in the support body, and a plurality of orifices from the channel to the sweeping surface.

DETAILED DESCRIPTION OF THE DRAWINGS

Figure 1:
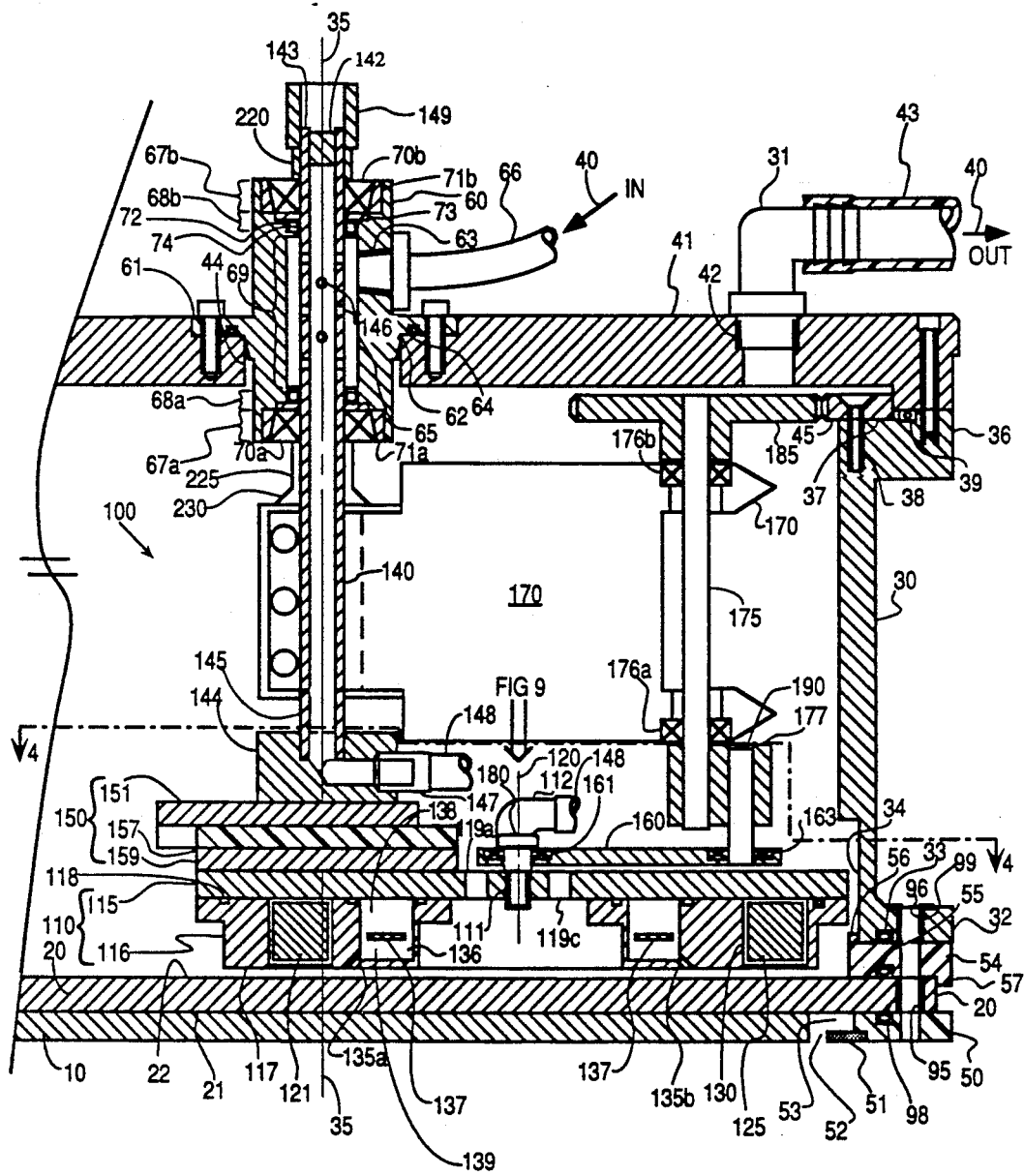
FIG. 1 shows a cross sectional view of a magnetron sputtering apparatus in accordance with an embodiment of the present invention.
Figure 4:
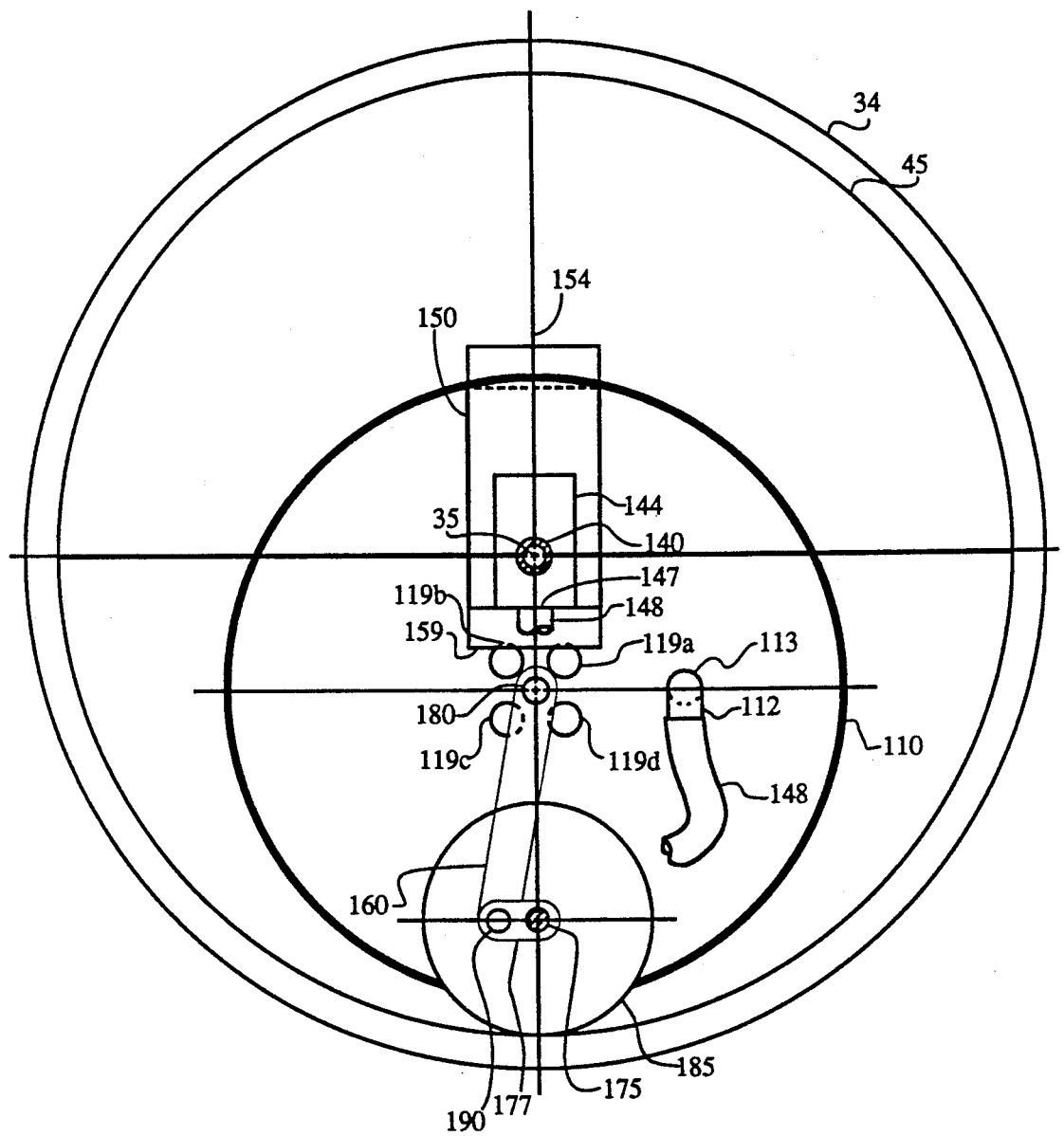

FIG. 4 shows an internal cross sectional view of FIG. 1 taken at section 4—4 with the outline of an external gear 185 and an internal gear 45 superimposed.

Figure 5:
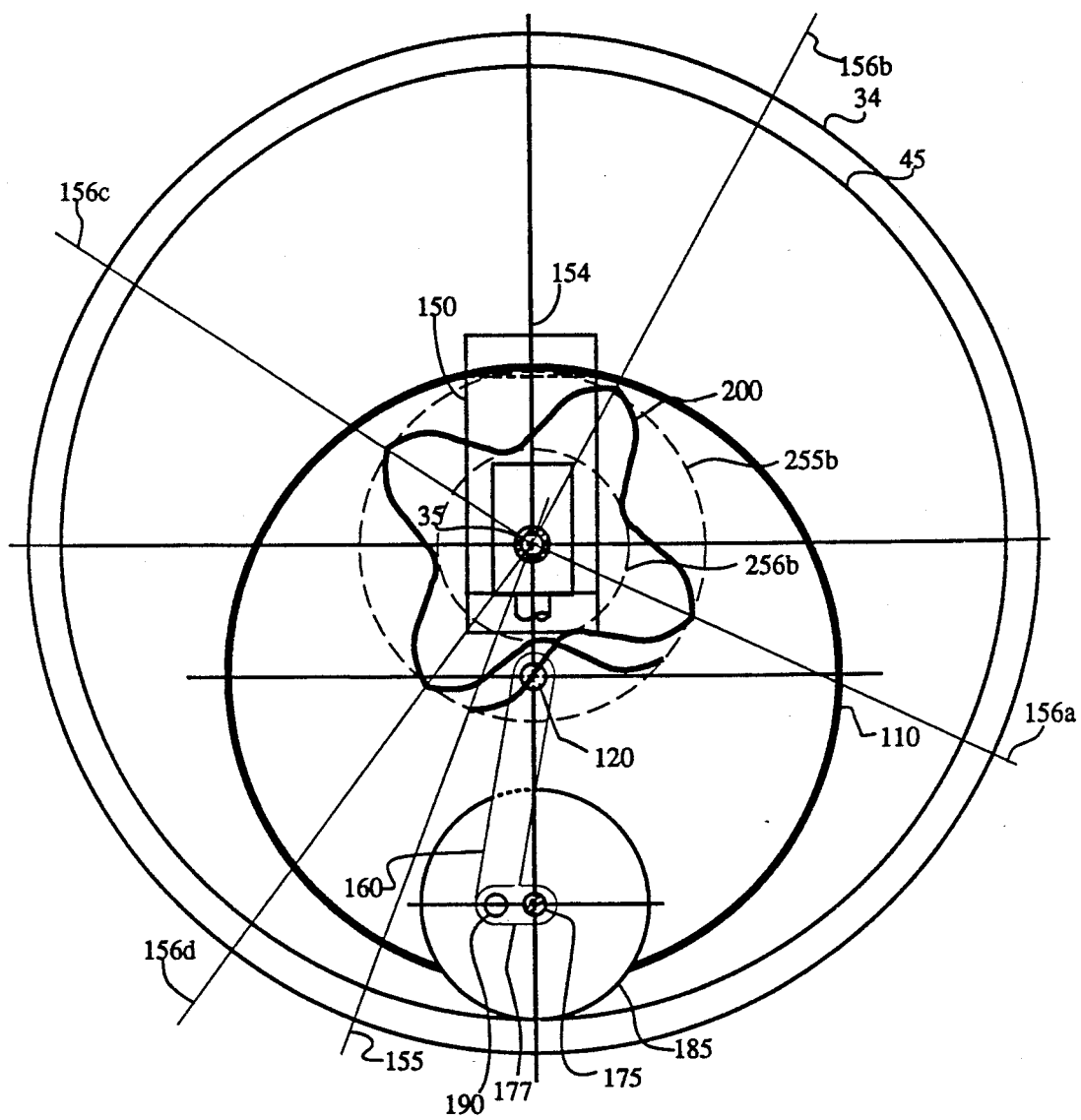

FIG. 5 shows the path 200 of the motion of the center of the magnet housing described in slightly more than one revolution of the drive shaft as superimposed on FIG. 4.

Figure 6:
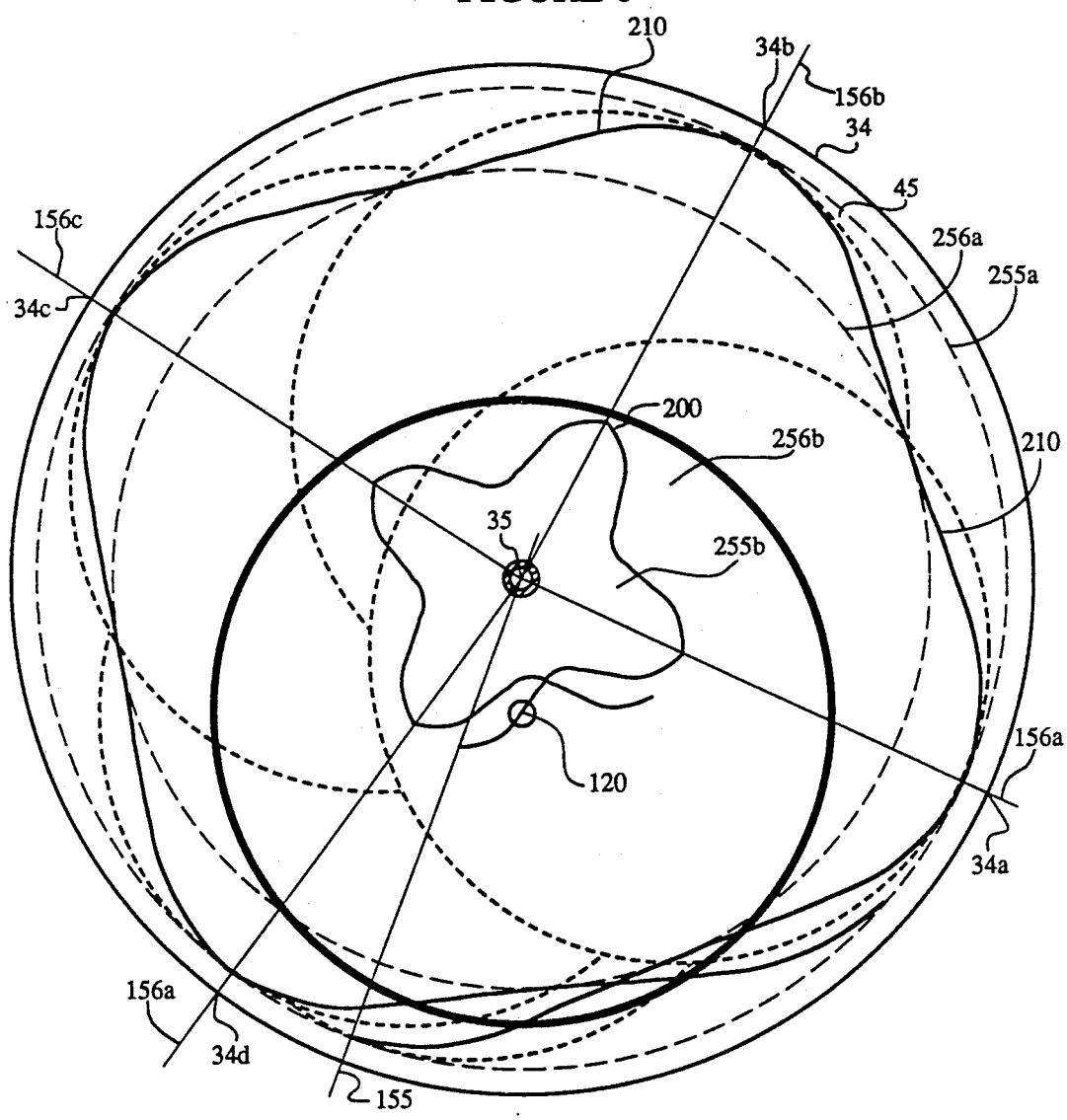

FIG. 6 repeats certain elements of FIG. 5 and shows five additional positions of the magnet housing which correspond to the positions of the magnet housing closest to the perimeter of the water chamber, and a tracing of the motion of a point of the magnet housing closest to the perimeter during approximately one revolution of the drive shaft.

Figure 7:
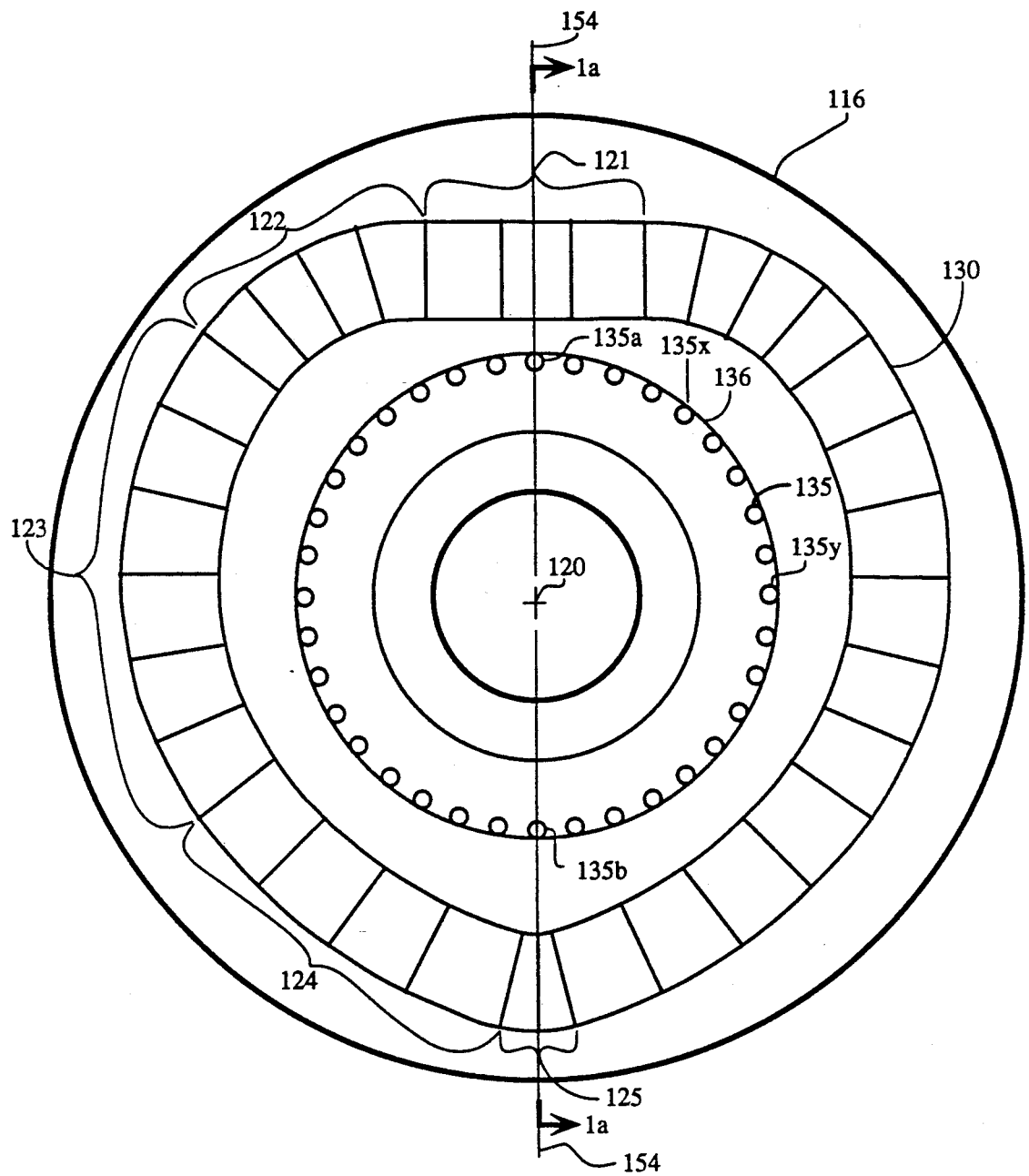

FIG. 7 shows a magnet housing body including a magnet track and a cooling channel with nozzles.

Figure 8B:
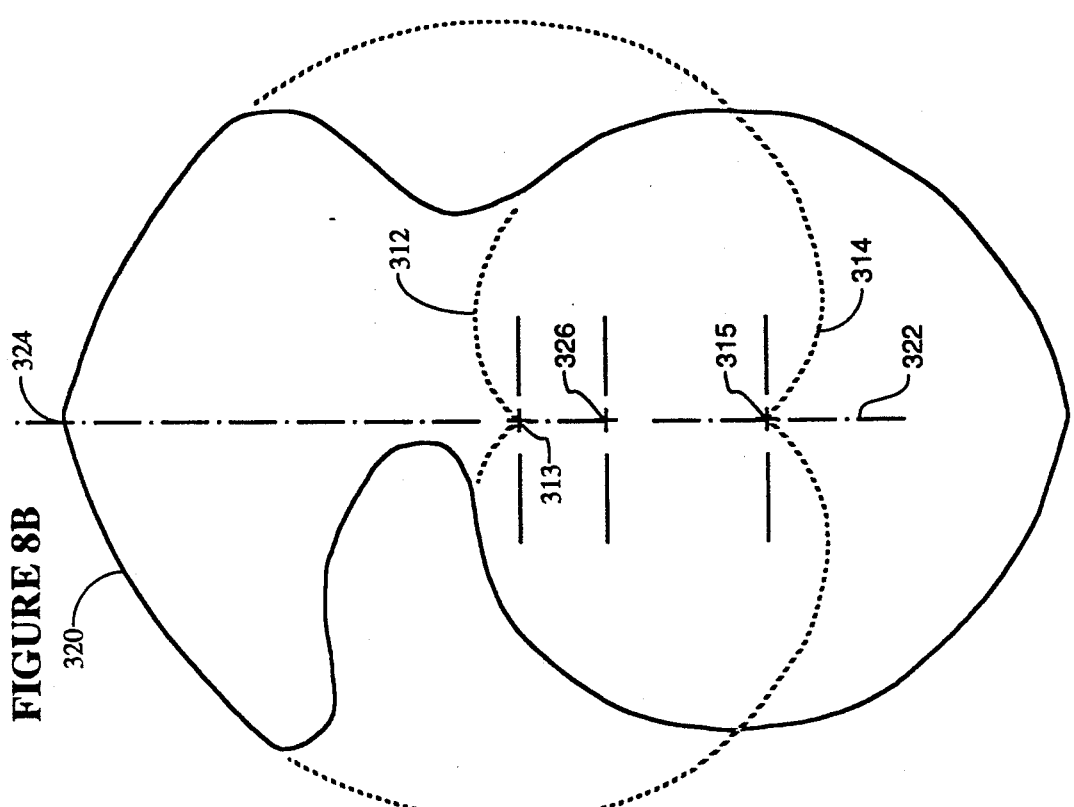
Figure 8A:
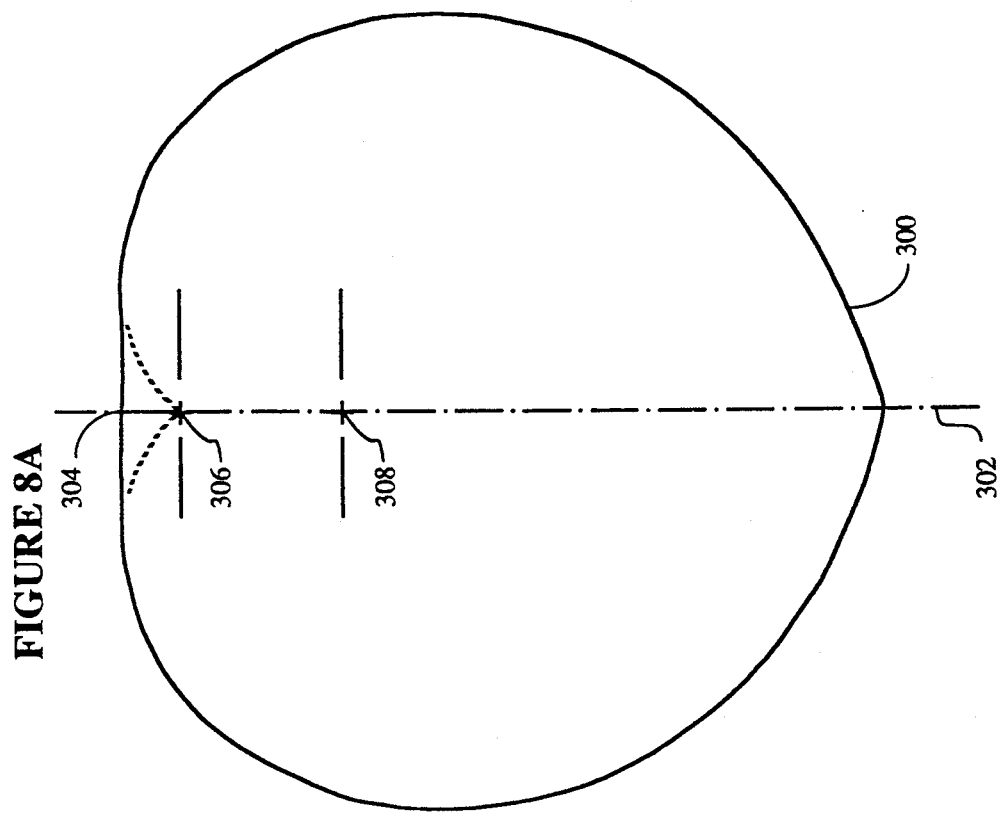

FIGS. 8A and 8B show two closed curve forms (not to scale) representing the shape of two illustrative magnet tracks.

FIG. 9 is a close-up view of the back of the magnet housing around its water inlet connection.

FIG. 10 is a cross section of the magnet housing taken at 10—10 in FIG. 9.

FIG. 11 is a cross section of the magnet housing taken at 11—11 in FIG. 9.

Figure 12:
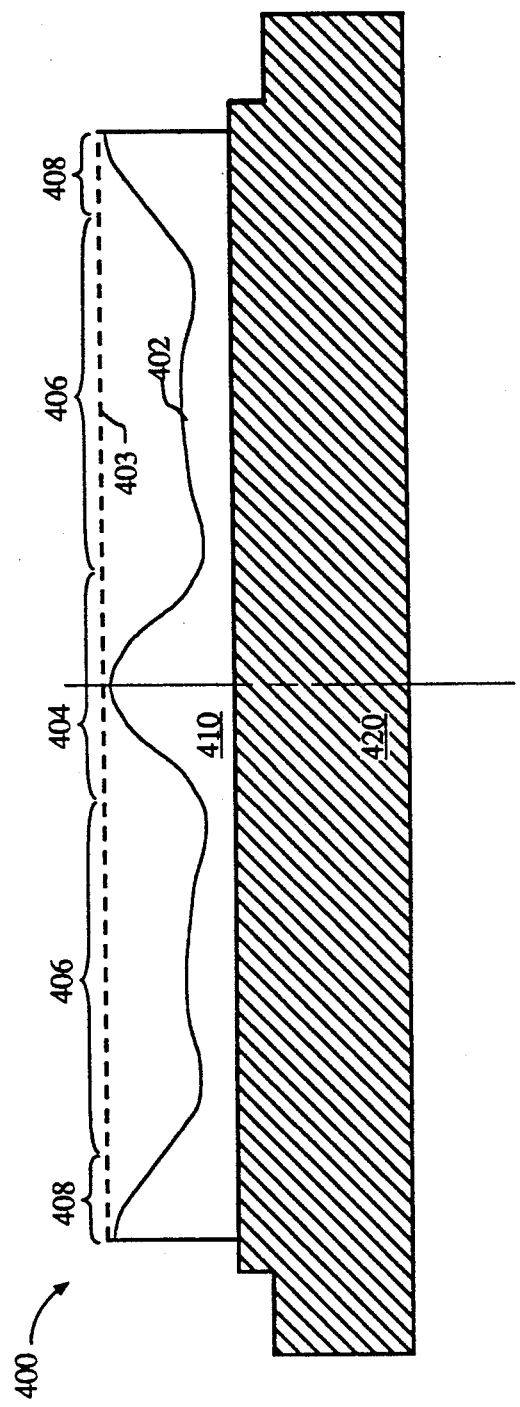

FIG. 12 is a cross-sectional view of a target eroded in accordance with the apparatus illustrated in FIGS. 1-7 and 9-11 (exaggerated vertical scale).

DETAILED DESCRIPTION OF THE INVENTION

In the plan of magnetron sputtering apparatus of FIG. 1, a sputtering target 10 is mounted on a front side 21 of a target backing plate 20 having a rotating mechanism 100 mounted within a water chamber 30 on a backside 22 of the target backing plate 20. The rotating mechanism 100 has a magnet housing assembly 110 containing magnets 121, . . . , 125 in a magnet track channel 130. The magnet housing assembly 110, which is eccentrically mounted on the rotating mechanism 100, is rotated by the rotating mechanism 100 about a common central axis 35 of the target 10 and water chamber 30. As the magnet housing assembly 110 is rotated by the rotating mechanism 100, it has an outer edge which is also radially oscillated between an extreme outer position closest to the perimeter (FIG. 6) and an extreme inner position farthest from the perimeter (FIG. 6). The collection of all the extreme inner and outer positions form two concentric circles 255a, 256a about the central axis (FIG. 6). The rotating magnet housing assembly 110 maintains a predetermined relationship coincident to a plurality of radial lines (e.g. 155 and 156 a, b, c, d) (FIGS. 5 and 6) connecting the common central axis 35 of the target 10 and water chamber 30 with points such as 34 a,b,c,d along the inside lower perimeter 34 of the water chamber 30 as the magnet housing assembly 110 linearly oscillates toward and away from the central axis 35. This oscillating motion on the backside 22 of the sputtering target 10 is accomplished by using a radial slide assembly 150 mounted to a block 144 at a bottom end 145 of a rotatable drive shaft 140. The radial slide assembly 150 supports the magnet housing assembly 110 which at its outer edge is oscillated between its extreme inner position 256a and its extreme outer position 255a by a connecting rod 160. The connecting rod 160 transmits a force which oscillates the magnet housing assembly 110 when the rotating mechanism 100 is rotated.

The rotating and oscillating motions of the magnet housing assembly 110 on the backside 22 of the target backing plate 20 in combination with the specially shaped magnet track channel 130 in the magnet housing assembly 110 provide a substantially uniform magnetic flux dwell time over a substantial portion of the target 10. As a result, a major part of the target is uniformly eroded for achieving high material utilization. Moreover, good deposition uniformity is realized on wafers measuring, for example, 6 or 8 inches in diameter, from a target 10 measuring 14.75 inches in diameter. As a result of this uniform magnetic field coverage, hot spots do not develop in the target backing plate 20, thereby enabling the power levels used for sputtering to be increased over those levels used in the prior art. The increased power levels increase the rate at which sputtered material is deposited on the wafer being processed and thereby provide greater efficiency and throughput.

Greatly increased power levels also increase the amount of thermal energy which must be dissipated to prevent the target 10 from overheating. In this embodiment, the thermal energy is dissipated by the injection of a cooled liquid (i.e. water or glycol) 40 which is routed directly to the back surface 22 of the conducting target backing plate 20 and generally adjacent to the magnets 121, . . . , 125 in the magnet housing assembly 110.

FIG. 1 shows a partial cross section of about one-half of the central axis 35 of the water chamber 30 while showing a complete cross section of the rotating mechanism 100. The device as shown is generally mounted on top of a magnetron sputtering chamber (not shown). This magnetic sputtering chamber has a magnetic sputtering chamber flange appropriate for mating with the bottom insulating O-ring 50. The magnetic sputtering chamber flange also has an O-ring containing sealing channel, as does the bottom insulating ring 50. A dark space ring 51 is press fit mounted inside the diameter of the bottom insulating ring 50 such that when the target backing plate 20, with the target 10 bonded to it, is placed with the target 10 facing the evacuated sputtering chamber, a small gap 52 of 3—6 mm or less exists between the edge of the target 10, which is circular in shape, and the inside edge of the dark space ring 51. A dark space 53 is formed behind the dark space ring 51 between the edge of the target 10 and the inside of the bottom insulating ring 50.

The bottom insulating ring 50 is made of an insulating material, such as nylon, which insulates the target backing plate 20 from the magnetic sputtering chamber housing (not shown). A top insulating ring 54 is provided on top of the target backing plate 20 to insulate it from the water chamber 30. The top insulating ring 54 is provided with an O-ring containing channel 55 facing the target backing plate 20 and with flanged shoulders 56, 57 to locate the top insulating ring 54 on the target backing plate 20 and to positively locate the water chamber 30 on the top insulating ring 54. The water chamber 30 has a bottom flange 32 which mates with the top insulating ring 54. This bottom flange 32 also has an O-ring containing channel 33 which seals its mating surface with the top insulating ring 54. The bottom insulating ring 50, the target backing plate 20, the top insulating ring 54, and the bottom flange 32 of the water chamber 30 adjacent to the top insulating ring 54 all have bolt holes 99 for passing a bolt or a stud (not shown) through them such that once the bolt or stud is tightly fastened, these pieces are held tightly together. Insulating the target backing plate 20 from its adjacent parts allows it to act as a cathode which, in concert with an anode (not shown), creates the electric field necessary for a plasma to form and magnetron sputtering to take place. A power level of approximately 30 kW is provided to the target backing plate 20. To prevent current leakage, bolt insulators 95, 96 are provided to line the flange hole 98 of the target backing plate 20 and the bolt hole of the water chamber flange 32, respectively, so that a bolt or stud (not shown) holding the flange set together does not conduct or easily leak electricity from the target backing plate 20 to either the evacuated sputtering housing (not shown) or the water chamber 30.

The water chamber 30, in this embodiment, is a short hollow aluminum cylinder. It is supported by the top insulating ring 54 to form a vertical cylinder within which the rotating mechanism 100 operates. The water chamber 30 has two flanges: a lower flange 32 and an upper flange 36. The lower flange 32 connects to the magnetic sputtering housing and is supported by it through a flange set containing the target backing plate 20. The upper flange 36 of the water chamber 30 has an inner landed shoulder 37 which contains a threaded bolt hole pattern 38. The face of the top flange 36 has an O-ring containing groove 39 for sealing the top flange 36 against a water chamber cover 41. The threaded bolt hole pattern 38 in the landed shoulder 37 of the upper flange 36 of the water chamber 30 mates with an internal gear 45 mounted to the lower land 37. This internal gear 45 is attached to the inner landed shoulder 37 of the upper flange 36 of the water chamber 30 and provides 348 gear teeth extending towards the center of the water chamber 30 having a 14.5 inch pitch diameter with a diametral pitch of 24. The water chamber cover 41 is supported by the face of the top flange 36 of the water chamber 30 and is sealed by O-rings in the O-ring channel 39 of the upper flange 36 of the water chamber 30. A bolt hole pattern matching the hole pattern of the upper flange 36 of the water chamber 30 is provided in the water chamber cover 41 so that these pieces can be water tightly mated. The water chamber cover 41 is circular and completely covers the top of the water chamber 30. It is made of a rigid non-corroding material such as aluminum.

The water chamber cover 41 has a water outlet opening 42 which provides the outlet for cooling liquid 40, which is directed by the magnetic housing 110 onto the target backing plate 20 to cool the target backing plate 20 during sputtering. This water outlet opening 42 provides nearly no back pressure to the cooling liquid 40 contained in the water chamber 30 as the cooling liquid 40 merely needs to rise in the water chamber 30 to attain the level of the water outlet connection in the water chamber 30 and provide enough pressure to drive the cooling liquid 40 out the water outlet opening 42 and through the attached fitting 31 and tubing 43 to its destination. The water chamber cover 41 has at its center a hole 44 having a bolt hole pattern around it. This central hole 44 supports a rotating support/seal block 60 having a flange 61 which mates with the central hole 44 in the water chamber cover 41. The rotating support-/seal block flange 61 has an O-ring containing channel 64 facing the water chamber cover 41 and a hole pattern which matches the bolt hole pattern in the water chamber cover 41 such that bolts placed in these threaded holes will liquid tightly hold the rotating support/seal block 60 to the water chamber cover 41. The inside part of the flange of the rotating support/seal block 60 has a shoulder 62 which mates with the outside diameter of the center hole of the water chamber cover 41 such that a tight fit is provided which prevents any lateral motion and provides a second means to locate the rotating support/seal block 60 in the water chamber cover 41.

The rotating support/seal block 60 has a hole 65 through its central axis which is also the vertical central axis 35 of the water chamber 30 and the target backing plate 20. This central axis of the rotating support/seal block 60 is designed to support and seal the rotating drive shaft 140. The support/seal block 60 acts as a rotating coupling which is part of the internal passage of cooling liquid 40 being routed into the water chamber 30. The rotating support/seal block 60 has an inlet opening 63 providing a threaded opening to connect feed tubing 66 to the central hole 65 in the rotating support/seal block 60. The drive shaft 140 is provided through the rotating support/seal block 60. The drive shaft 140 is hollow from one end to the other. A welded plug 142 is welded inside the top end 143 of drive shaft 140, closing the shaft opening to the top and an end block 144 is provided on the shaft 140 at its bottom end 145. The drive shaft end block 144 supports a portion of the rotating mechanism and provides a fluid outlet opening from the drive shaft's hollow central fluid passage.

The hole 65 in the center of the rotating support/seal block 60 consists of several sections: two bearing sections 67a and 67b, two sealing sections 68a and 68b, and a water section 69.

The two end bearing sections 67a, 67b hold respective bearing races 71a and 71b such that respective roller bearings 70a and 70b mounted on the drive shaft 140 roll in these races 71a, 71b and provide the rotating support between the stationary rotating support/seal block 60 and the rotating drive shaft 140. The roller bearings 70a, 70b are held in contact with their respective races 71a, 71b by, respectively, spacers 220 and collars 225 with spring washer 230, only one set (several of which might be installed) being shown in FIG. 1, or other suitable means which connect to the drive shaft 140. These collars and spring washers locate the bearings 70a, 70b on the drive shaft 140 and hold the drive shaft 140 in a predetermined relationship with the rotating support/seal block 60.

The two sealing sections 68a, 68b of the rotating support/seal block 60 are located inboard from the bearing sections 67a, 67b. Each of the sealing sections 68a, 68b comprises a seal containing channel 72 along with a seal containing washer 73. A circular ring seal 74 constructed of resilient material (i.e., Buna-N rubber) having a U-shaped cross section is provided around the shaft 140 in the seal containing channel 72. The opening at the top of the "U" in the U-shaped seal cross section in each seal faces towards the center of the rotating support/seal block 60. The sealing washer 73 is disposed between the seal 74 and its external adjoining bearing 70a, 70b such that the washer forms the bottom side of a three-sided box against which the U-shaped seal 74 rests. The inside of the U-shape is pressurized by fluid pressure emanating from the water section 69 of the rotating support/seal block 60. The water section 69 is at the center of the support/seal block 61 between the two sealing sections 68a, 68b. When liquid pressure is provided to the water section 69 of the rotating support-/seal block 60, the sides of the U-seal 74 expand, against the rotating support/seal block 60 on one side and the drive shaft 140 on the other side, to seal the opening between the drive shaft 140 and the rotating support-/seal block 60. The water section 69 at the center of the rotating support/seal block 60 is of a larger diameter than the outside of the drive shaft 140.

The inlet opening 63 to the water section of the rotating support/seal block 60 provides a passage for cooling liquid 40 to pass from the inlet tubing 66 into the water section 69 of the rotating support/seal block 60.

The drive shaft 140 being hollow and plugged at one end 143 and having an end block 144 at its other end 145 also has cross drilled holes 146 (drilled through from one side to the other at 90°) in five locations within the water section 69 of the rotating support/seal block 60, as located when assembled. As the drive shaft 140 is positioned, supported, and sealed within the rotating support/seal block 60, water passing into the water section 69 passes through the cross drilled holes 146 of the drive shaft 140 and into the hollow center of the drive shaft 140. The drive shaft 140 is disposed along the center line 35 of the water chamber 30 and extends from a point above the rotating support/seal block 60, where the drive shaft 140 is connected to a coupling 149 which is connected to a motor or gear motor (not shown), to a point within the water chamber 30 where the end block 144 of the drive shaft 140 is connected to a radial slide assembly 150. The drive shaft 140 is rotatably held at this location by the roller bearings 70a, 70b.

Connected to the side of the drive shaft 140 in between the rotating support/seal block 60 and the end block 144 of the drive shaft 140 is a drive shaft arm 170. This arm 170 is clamped or otherwise firmly connected to the drive shaft 140 at a fixed predetermined location such that the arm 170 rotates with the drive shaft 140, when the drive shaft 140 is rotated. The bottom end block 144 of the drive shaft 140 is firmly connected to a radial slide top 151 of the radial slide assembly 150.

Figure 2:
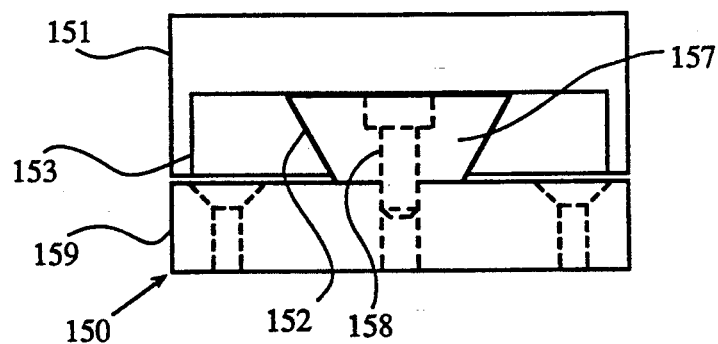
FIG. 2 shows an end view of a radial slide of FIG. 1.
Figure 3:
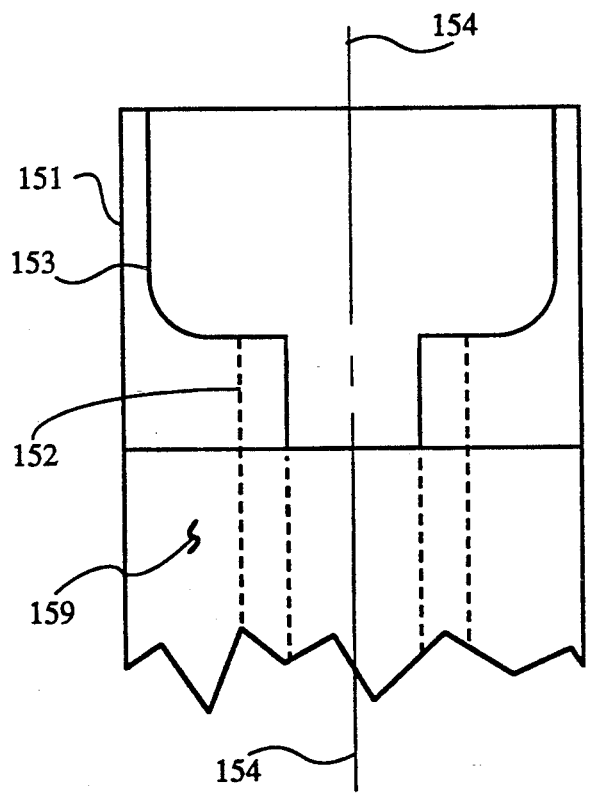
FIG. 3 shows a partial bottom view of FIG. 2 with the top of the radial slide 151 offset from its bottom 159.

The radial assembly slide 150 (FIGS. 1, 2, & 3) includes two rectangular pieces of rigid material, the slide top 151 and a slide bottom 159, preferably made of strong lightweight material such as aluminum, in a closely spaced relationship as shown in FIG. 2. The radial slide top 151 has one side whose longitudinal central axis 154 is cut with a slot 152 along the full length of the piece. The slot 152 has a dovetail shaped section for most of its length while a rectangular section 153 of the slot closest to a hole 111 in the center of the magnet housing assembly 110 is rectangularly shaped and wider than the dovetail section of slot 152. The rectangular section 153 provides clearance for movement of a head of a shoulder bolt 180, which is threaded into the hole 111 of the magnet housing assembly 110, as the bolt 180 moves with the center 120 of the magnet housing assembly 110 into the outline of the radial slide top 151. The shoulder of the shoulder bolt 180 acts as a bearing journal for a connecting rod bearing 161 which rotatably connects and moves the magnet housing assembly 110 along the central axis 154 of the slot 152 as the connecting rod 160 transmits a motive force. A radial slide dovetail protrusion 157, made of delrin, nylon or other material having a high lubricity, is attached by countersunk screws such as 158 to the radial slide bottom 159. The radial slide dovetail protrusion 157 when inserted in the radial slide top dovetail slot 152 causes the radial slide bottom 159 to easily slide linearly along the central axis 154 longitudinal to the dovetail slot 152 (FIGS. 2 and 3). The radial slide top 151 is connected to the drive shaft 140 in a predetermined offset relationship wherein the rectangularly relieved end 153 of the radial slide top 151 is attached to the drive shaft bottom end block 144 so that the other end of the radial slide top 151 overhangs the block 144 (FIG. 1). The radial slide bottom 159 is connected to the magnet housing assembly 110.

The magnet housing assembly 110 includes a magnet housing body 116 having a magnet track channel 130 and a cooling channel 136 formed therein with a magnet housing cover 115 enclosing both the magnet track channel 130 and the cooling channel 136 (FIGS. 1 and 7). The magnet housing assembly 110 is circular and has the threaded hole 111 at its center. The magnet housing body 116 is annularly shaped having an opening at its center. The magnet track channel 130 and the cooling channel 136 are formed in the top side of the annular shaped magnet housing body 116 around its central opening. The magnet track channel 130 has a uniform regular rectangular shape at any given cross section perpendicular to the centerline of the channel; the shape formed by the magnet track channel is discussed below. Specially cut magnet segments 121, . . . , 125 conforming closely to each other and the walls of the magnet track channel are placed in the magnet track channel 130 (FIG. 7).

The cooling channel 136 in the magnet housing body 116 forms an annular ring having a uniformly rectangularly shaped cross section at any point perpendicular to the centerline of the channel. The outside diameter of the ring is less than the inside dimension of any part of the magnet track channel 130.

A series of angularly disposed holes (nozzles) 135 (including nozzles 135a,b,x,y) connect a bottom surface 117 of the magnet housing body 116, facing the backside 22 of the target backing plate 20, and the inside of the cooling channel 136. These are called orifice water outlets 135.

The magnet housing cover 115 also covers and seals the cooling channel 136. Various O-ring containing channels such as 118 (others shown but not numbered to preserve clarity) are provided on both sides of the cooling channel 136 in the magnet housing body 116 and on the extreme outside of the magnet track channel 130 so that when the magnet housing cover 115 is firmly attached to the magnet housing body 116 by bolts or some other reliable and easily-detachable means, the magnet track channel 130 is sealed, preventing leakage into the magnet track channel 130. The cooling channel is sealed to assure that flow of all cooling liquid is out through the nozzles 135 and not through some other undesired path.

While the magnet housing body 116 is open at its center (annularly shaped), the magnet housing cover 115 is provided with the threaded hole 111 at its center, which corresponds to the center of the magnet housing assembly 110. Around the threaded hole 111 and the inside of the annular portion of the magnet housing body 116 a series of openings 119a,b,c,d are provided to allow fluid flow through the center of the magnet housing assembly 110. These openings 119a,b,c,d are sized so as not to adversely impact the structural integrity of portions of the magnet housing cover 115 connecting its outer annular portion to the threaded bolt hole 111 at its center (FIG. 4). In FIG. 1 holes 119a and 119c are shown to illustrate their location with respect to other pieces, even though the holes 119a and 119c are offset 45° from this location, as can be seen in FIGS. 4 and 9.

A water connecting hole 113 is provided on back of the magnet housing cover 115 to accommodate an inlet water fitting 112 (FIGS. 1,4,9, and 11). The location of this inlet water connection 112 on the magnet housing cover 115 matches the location of the cooling channel 136 in the magnet housing body 116 in such a way that when cooling liquid 40 passes through the inlet water fitting 112 and water connection hole 113, it goes directly into the cooling channel 136.

The bottom end block 144 of the drive shaft 140 has a closed fluid passage from the center of the hollow drive shaft 140 to a shaft outlet water connection 147. A length of tubing 148 is provided connecting between the shaft outlet water connection 147 and the magnet housing inlet water fitting 112 such that a cooling liquid 40 flowing out of the bottom end 145 of the drive shaft 140 will flow into the cooling channel 136 of the magnet housing body 116 by flowing through the tubing 148.

The cooling channel 136 also contains a diffusion ring 137 which divides the cooling channel 136 into a cooling channel top portion 138 and a cooling channel bottom portion 139. The diffusion ring 137 provides a means for diffusing the pressure of the cooling liquid 40 injected at one (or more) location in the cooling channel top portion 138 so that pressure is equalized as the cooling liquid flows around the edges of the diffusion ring to the cooling channel bottom portion 139 and exits a plurality of orifice water outlets 135 (FIGS. 1, & 9-11). This diffusion ring 137 is supported by a fixed means 133 from the magnet housing cover 115 and provides one or more orifice openings (holes, slots 134a, 134b, or a combination) internally or in a spaced relationship with the wall of cooling channel 136 to assist in equally distributing the pressure on the cooling channel top portion 138 to the cooling channel bottom portion 139. In this way, a nearly uniform pressure is assured at the inlet side of each of the orifice water outlets 135 (in one embodiment there are 36 outlets). The outlets 135 are spaced a predetermined distance apart in a circular pattern in the magnet housing body 116. The nearly uniform pressure distributed around the cooling channel bottom portion 139 provides nearly uniform cooling liquid flow out each of the nozzles 135.

The shoulder of the shoulder bolt 180 connected and retained in the hole 111 of the magnet housing cover 115 acts as a journal for the connecting rod bearing 161 which is a ball bearing. The bearing 161 operatively connects one end of the connecting rod 160 to a point (e.g. the central axis 120) on the magnet housing assembly 110 at which the journal is located so that the force can be transmitted.

A gear shaft 175 is generally parallel to but spaced a predetermined distance from the central axis 35 of the drive shaft 140 within the water chamber 30. The drive shaft arm 170 which is clamped to (or otherwise firmly fixed to) and rotates with the drive shaft 140, provides support for the gear shaft 175. The gear shaft 175 is supported by gear shaft bearings 176a and 176b mounted on the drive shaft arm 170 close to its end. The gear shaft 175 is supported by the drive shaft arm 170 in such a manner that teeth of an external gear 185 mounted at a top end of the gear shaft 175 mesh with the teeth of the internal gear 45 mounted inside and at the top end of the water chamber 30. When the drive shaft 140 is rotated also rotating the drive shaft arm 170, the teeth of the external gear 185 continue their meshing relationship with the internal gear 45 and thereby rotate the gear shaft 175. The bottom end of the gear shaft 175 beyond the bottom of the drive shaft arm 170 has one end of a gear shaft crank arm 177 clamped (or otherwise fixedly attached) to it.

One end of a drive pin 190 is clamped (or otherwise fixedly attached) to the other end of the gear shaft crank arm 177. The drive pin 190 is located a fixed distance away from the gear shaft 175 and generally parallel to it. As the gear shaft 175 rotates, when the drive shaft 140 is turned, the gear shaft crank arm 177 turns about the central axis of the gear shaft 175 which causes the drive pin 190 to move with the gear shaft 175 and describe a circular path around the gear shaft 175 with respect to the gear shaft 175. The other end of the drive pin 190 acts as a journal for the center of a second connecting rod bearing 163, a ball bearing, which is connected to one end of the connecting rod 160. The other end of the connecting rod 160 is connected to the shoulder bolt 180 at the center of the magnet housing assembly 110, as described above. As the drive shaft 140 is rotated, the gear shaft 175 rotates the drive pin 190 about the gear shaft 175, and the connecting rod 160 is thereby moved by the drive pin 190 and causes the magnet housing assembly 110 to slide back and forth along the longitudinal axis 154 of the dovetail slot 152 in the radial slide assembly 150.

The shaft spacer (collar) 225 and the spring washer (spring collar) 230, along with other devices as necessary typically are provided along the drive shaft 140 to hold the drive shaft bearings 70 in a predetermined relationship with the drive shaft 140 and to hold the gear shaft crank arm 177 in a predetermined aligned relationship with its rotating support/seal block 60. The gear shaft bearings 176a, 176b and gear shaft 175 are also held in a fixed relationship with the drive shaft arm 170, the water chamber 30, and internal gear 45 by spacers (not shown). The spacers are located on the gear shaft 175 between the attachment (by clamping or other method of fixedly connecting) of the external gear 185 to the top end of the gear shaft 175 and attachment of the gear shaft crank arm 177 at the bottom end of the gear shaft 175. These spacers assist in holding the gear shaft bearings 176a, 176b fixed to the drive shaft arm 170 in a predetermined relationship. Spacers, washers, and other devices (not shown) are used as required to keep the various pieces in their prescribed relationship. The drive shaft 140 is connected through the coupling 149 to a motor or gear motor (not shown) which rotates the drive shaft 140.

Motion is imparted to the magnet housing assembly 110 as follows. As the drive shaft 140 rotates in the rotating support/seal block 60, the drive shaft arm 170 and the drive shaft lower end block 144 also rotate. This rotation causes the rotating mechanism 100 (the radial slide assembly 150, the magnet housing assembly 110, the external gear 185, the gear shaft 175, and all pieces directly connected to those pieces) to rotate about the central axis 35 of the drive shaft 140. As the rotating mechanism 100 rotates, the teeth of the external gear 185 mesh with the teeth of the internal gear 45 causing the external gear 185 and the gear shaft 175 to rotate about the gear shaft's axis as the drive shaft 140 rotates about the central axis. As the gear shaft 175 rotates about its axis, the gear shaft crank arm 177 clamped to the bottom end of the gear shaft 175 also rotates causing the drive pin 190, which is clamped to the other end of the gear shaft crank arm 177, to rotate about the gear shaft axis as the gear shaft 175 rotates. As the drive pin 190 moves in a circular path about the gear shaft axis, the drive pin 190 together with the gear shaft crank arm 177 act as a crank shaft to force the end of the connecting rod 160, mounted to the end of the drive pin 190, by a ball bearing, to move with the pin 190 as it rotates. Since the gear shaft 175 is held in a fixed relationship with (clamped to) the drive shaft 140, to which is mounted the radial slide top 151, the movement of one end of the connecting rod 160, with the rotating pin 190, moves the other end of the connecting rod 160 connected to the center of the magnet housing assembly 110 fixed to the radial slide 150 and causes the radial slide bottom 159 to oscillate along the central axis 154 of the radial slide 150 in conjunction with the motion of the drive pin 190. The radial slide bottom 159 is fixed to the magnet housing assembly 110 which therefore also oscillates. The magnet housing assembly 110 therefore oscillates as the drive shaft 140 is turned.

The radial slide assembly 150 connected to the end of the drive shaft 140 prevents the magnet housing assembly 110 from moving in a vertical direction, as seen in FIG. 1. The motion of the magnet housing assembly 110 is limited to a direction parallel to the longitudinal direction 154 of the dovetail slot 152 in the radial slide 150.

FIGS. 2 and 3 show end and bottom views of the radial slide 150 which hold the magnet housing assembly 110 aligned with the central axis 154 of the dovetail slot 152. A rectangular section 153 of the end of the radial slide top 151 is relieved to allow the shoulder bolt 180 to move into the end of the radial slide top 151, and avoid interfering with it, as the magnet housing assembly 110 moves into the radial slide 150 at a point in the oscillation where the magnet housing assembly 110 moves closest to the central axis 35 of the water chamber 30 as the radial slide bottom 159 is moved by the connecting rod 160.

FIG. 4 shows the magnet housing assembly 110 within the water chamber 30 as viewed from above, cut at a cross section 4—4 in FIG. 1, but with the external gear 185 and internal gear 45 superimposed. The gear shaft crank arm 177 is shown 90° to a vertical (as seen in FIG. 4) centerline of the water chamber 30. It shows the connecting rod 160 connecting the drive pin 190 with the shoulder bolt 180 at the center of the magnet housing assembly 110. The radial slide bottom 159 is at approximately one-half of its travel between its innermost and outermost positions. The bottom piece 144 of the drive shaft 140 is also shown. The water connection 147 on the end block 144 of the drive shaft 140 is shown connecting by the tubing 148 (partially shown in two places) to the magnet housing inlet water fitting 112. As the drive shaft 140 rotates, the water connection 147 of the drive shaft end block 144 also rotates as does the magnet housing assembly 110 and the tubing 148. The flexible tubing 148 accommodates a linearly oscillating motion as the magnet housing assembly 110 moves toward and away from the center 35 of the water chamber 30 as it is rotated by the drive shaft 140. The external gear 185 and the internal gear 45 are shown superimposed on cross section 4—4, as described above. The external gear 185 rolls on the internal gear 45 which is mounted on a landed shoulder of a top flange of the inside perimeter of the water chamber 30. As the external gear 185 rotates, it causes the gear shaft crank arm 177 to rotate with it causing the drive pin 190 to drive the connecting rod 160 and the shoulder bolt 180 connected into the magnet housing assembly 110 to move the magnet housing assembly 110 in an oscillatory motion along the central axis 154 of the dovetail slot 152 in the radial slide assembly 150.

FIG. 5 partially superimposes on FIG. 4 a tracing 200 of the path of the motion made by the central axis 120 of the magnet housing assembly 110 as the drive shaft 140 moves through slightly more than one revolution. FIG. 5 depicts the magnet housing assembly 110 as it would appear at a location where the external gear 185 has turned 90° from a location where the gear shaft crank arm 177 is closest to the inside perimeter 34 of the water chamber 30 and parallel to a radial axis 155 of the drive shaft arm 170. In FIG. 5 the radial reference line 155 located just to the left of the external gear 185 defines a beginning and an end of one full revolution of the magnet housing assembly 110 and also is a location where the magnet housing assembly 110 is at an outer extreme point in its oscillation, i.e. closest to the perimeter 34 of the water chamber 30. The curve 200 shows the path of the motion of the center 120 of the magnet housing assembly 110. As the external gear 185 rotates on the internal gear 45, the connecting rod 160 causes the motion of the center of the magnet housing assembly 110 to follow the pointed cam-like path 200 traced in FIG. 5. It should be noted, as shown in FIG. 5, that the motion of the magnet housing assembly 110 does not immediately repeat itself. The number of teeth in each of the gears are selected to avoid a short cycling time, i.e. in one embodiment 83 full revolutions of the external gear 185 are necessary before any selected reference tooth on the external gear 185 will once again contact a similar reference tooth on the internal gear 45. FIG. 5 shows a tracing of the motion at the center of the magnet housing assembly 110 for five rotations of the external gear 185 with respect to its contact with the internal gear 45. As can be seen in FIG. 5, it takes approximately 4.19 revolutions of the external gear 185 to complete one revolution within the internal gear 45. An arc of approximately 86° taken from the center of the water chamber 30 is swept for the magnet housing assembly 110 to complete one full cycle (in and out). The path of all extreme innermost and outermost points reached by the center 120 of the magnet housing 110 is depicted by circles 256b and 255b, respectively.

FIG. 6 repeats the tracing of the motion made by the central axis 200, shown in FIG. 5, with an overlay depicting the location of the magnet housing assembly 110 shown with gray lines at various locations around the water chamber 30 at points where the magnet housing assembly 110 would come closest to the water chamber internal lower wall 34. FIG. 6 also shows a tracing 210 of the path of the motion of a point on the edge of the magnet housing assembly 110 closest to the water chamber wall 34 as the assembly progresses in its motion around the central axis of the water chamber 30. The radial axes 156a, 155, 156b, 156c, and 156d shown correlate the outer extremes of the motion of the center of the housing 120 and the point at the outermost edge of the housing progressively during one revolution of the magnet housing 110. As can be seen in FIG. 6, this motion when compared to the diameter of the water chamber 30, exhibits a relatively high degree of variation when compared to the diameter of a circle passing through the center of the magnet housing assembly 110, and exhibits a relatively gentle diametral variation when compared to the diameter of the water chamber 30 at the inside wall lower 34 of the water chamber 30.

FIG. 7 shows the magnet track channel 130 in the magnet housing body 116 of the magnet housing assembly 110. The magnet track channel 130 is a flattened teardrop shape, which is moved in a combination radially oscillating and circularly rotating motion nearly completely covering the back of the target backing plate 20. A magnet housing axis 154 as shown directly corresponds to the radial slide central axis 154, and as the magnet assembly rotates in the water chamber 30 this centerline becomes parallel with each of the radial axes, i.e., 155, 156 a,b,c,d, as the magnet housing rotates around the center. The geometric relationship between the cooling channel 136, the nozzles 135, and the magnet track 130 is also pictured. The cross section of the magnet housing body 116 is shown as part of FIG. 1 cut at section 1a–1a. The bottom of the housing as shown in FIG. 7 is the point on the housing 110 which is always closest to the water chamber lower inner wall 34. The curve 210 in FIG. 6 is a tracing of the motion at this point.

In the embodiment described above, the drive shaft 140 is turned at a speed of 20 to 60 rpm. The internal gear 45 has 348 teeth, while the external gear 185 has 83 teeth. The gear shaft crank arm 177 provides a 0.615 inch arm to cause the magnet housing assembly 110 to have a total stroke of 1.23 inches in a water chamber 30 having an inside lower diameter of approximately 15.51 inches at its bottom end facing the target backing plate 20. The outside of the magnet housing body 116 is approximately 8.62 inches in diameter with its body 116 having a centrally located open space having a diameter of approximately 2 inches.

The flattened teardrop magnet track shape in the magnet housing body 116 has a generally uniform width of approximately 0.91 inches and is straight at a top portion (as seen in FIG. 7) for a total distance of approximately 2.12 inches. When the magnet housing is in the water chamber 30, this top portion is closest to the center 35 of the water chamber 30.

The flattened teardrop shape is symmetrical about a center line along the central axis 154 of the radial slide 150 when mounted to the magnet housing body 116. The medially located side of the straight top portion of the flattened teardrop shaped channel is perpendicular to the symmetrical axis 154 at a point 2.78 inches up from the center 120 of the magnet housing body 116, as seen in FIG. 7. The flattened teardrop shape as traced from the top to the bottom on the right side (the left side being symmetrical) is described as follows. One half of the total length of the straight top, a straight piece 1.06 inches long, starts from the central axis 154 and runs perpendicular to it at the top of the magnet housing body 116. It is connected by a smooth tangential connection to a 54° arc having an inside radius of approximately 1.75 inches from a center referenced 1.060 inches to the right and 1.030 inches up from the center of the housing. After the 54° arc, a second radius smoothly connected to the first arc is turned with a 3.06 inch radius for 72° (the arc center being along the symmetrical axis and 0.250 inches up from the magnet housing center). This arc is smoothly connected to a 38° arc which is turned at a radius of 4.38 inches (the arc center being 1.060 inches up and 1.030 inches to the left of the magnet housing center). A 16° arc, completing half of the track, is turned with a radius of approximately 0.535 inches (the arc center being along the symmetric axis and 2.667 inches down from the magnetic housing center).

The magnets 121, . . . , 125 in magnet track 130 are constructed of high strength neodymium-iron-boron (NdFeB) which fit together with each other and in the magnet track with negligible gaps. The magnetic field may be generated by any other suitable mean, however, including other permanent magnetic material as well as electrical induction. All magnets are oriented so that their north pole is at the perimeter and their south pole is closest to the center of the magnet housing assembly 110. The magnets 121-125 generate a peak parallel field strength of from 2800 to 3200 gauss on the surface of the magnet housing assembly 110.

FIG. 12 is a cross-sectional view of a target assembly 400 comprising target 410 and backing plate 420. The target 410, shown after having been eroded in accordance with the movement of magnet track channel 130 of FIG. 7 as shown in FIGS. 5 and 6, is useful for illustrating the theory in accordance with which erosion of the target is believed to occur. An outline 403 of the target prior to sputtering is shown in a dashed line, and a surface profile 402 subsequent to sputtering is shown in a solid line. Three regions are identified in the surface profile 402: center circular region 404, major annular region 406, and perimeter annular region 408. All of the regions 404, 406 and 408 are subject to erosion. Erosion in the major annular region 406 is substantially uniform, indicating that a substantially uniform magnetic flux per unit area was achieved over a large percentage of the target 400. Accordingly, a large percentage of the target was fully utilized. Erosion in the center circular region 404 occurred at a lower rate than erosion in the major annular region 406. The lower rate of erosion in the center region 404 had no significant adverse impact on the uniformity of deposition, yet admitted of two advantages. First, a low rate of erosion ensured that the center of target 400 was not penetrated through to its target backing plate 420 before full utilization of the major annular region 406. Second, a finite erosion ensured that no sputtered material re-deposited onto the center of the target 400, from which it could have flaked and contaminated the wafer being processed. Erosion in the perimeter annular region 408 occurred at a lower rate than erosion in the major annular region 406. Although low, the rate of erosion was sufficient to ensure that no sputtered material precipitated onto the center of the target 400.

Generally, a substantially uniform magnetic flux per unit area in the major annular region of a target is achieved by selecting the magnet track shape so that as a given magnet track is swept behind a target, the erosion at a given point of the target is a function of the strength of the magnetic flux from the magnet track parallel to the target surface and the dwell time. Dwell time is a function of the tangent to the magnet track at the given target point; the greater the angle of the magnet track tangent to the circle radius, the greater the dwell time. Hence, the preferred magnet track shape and motion is that which increases tangency with increasing radial distance throughout the circular target area in such way as to achieve substantially uniform magnetic flux with increasing radial distance.

The closed curve 300 illustrated in FIG. 8A is the basis for the shape of the magnet track 130. Curve 300 is derived from the expression $$\theta = \sin^{-1}\left(\frac{1}{r}\right) + \sqrt{r^2 - 1} + C \quad (1)$$

where Theta as a function of radius defines a curve in polar coordinates, "r" is the radius from a curve center, and "C" is an initial starting angle. A scaling factor is applied to "r" to enlarge the curve to a 14 inch by 14 inch area. To obtain the curve 300, C was set to $\pi/2$ (ninety degrees) and Theta was turned from about fifteen degrees to one hundred eighty degrees, resulting in r values ranging from one to 4.60. A scaling factor of 1.12 inches was applied, and the resulting curve was reflected across an axis of symmetry 302 to form a closed curve of one cusp and one loop. The cusp is flattened a distance of 0.45 inches from the center of the curve 300 to accommodate limitations in machining the magnets 121 of the magnet track 130. The magnets 21-25 are position with their respective north and south pole edges equidistant from the curve 300, each being spaced 0.455 inches therefrom.

As a result of the radially oscillatory motion imparted to the magnet track 130, sufficient uniformity of the magnetic flux dwell time in the major annular region of the target 10 is achieved. We have found that by deemphasizing optimal uniformity of the magnetic flux dwell time in the major annular region of the target 10, we are able to realize three notable effects. First, the straight line segment at the cusp end of curve 300, which is realized in the magnet track 130 by magnets 121, is swept within the central region of the target 10, alternately maximizing and minimizing the influence of the magnet channel 130 on the central region of the target 10. Advantageously, the effect is sufficient to prevent redeposition of sputtered material on the target 10, while avoiding depletion of the target material in the center prior to full utilization of the target material in the major annular region. Second, as the cusp end of curve 300 is swept within the central region of target 10, the loop end of the curve 300, which is realized in the magnet track 130 by magnets 125, approaches and retreats from the chamber wall 34, alternately maximizing and minimizing the influence of the magnet channel 130 on the perimeter region of the target 10. Advantageously, the effect is sufficient to prevent redeposition of sputtered material on the target 10. Third, the motion extends the major annular region of substantially uniform magnetic flux dwell time without adversely affecting the uniformity of material deposition on the wafer.

The radially oscillatory motion and the circularly rotational motion may be achieved in any suitable manner. In the embodiment of FIG. 1, the radially oscillatory motion and the circularly rotational motion of the magnet track 130 are uniquely associated with respective mechanisms, namely radial slide 150 and drive shaft/drive shaft arm combination 140 and 170 respectively. The instantaneous center of the circularly rotational motion varies in accordance with the radially oscillatory motion. When the loop of magnet track 130 is nearest the lower perimeter 34 of the water chamber 30 in the extended or OUT position, the instantaneous center of the circularly rotational motion relative to the curve 300 is at point 306, which corresponds to the center of the curve 300 and is 0.45 inches inside the closed curve 300 as measured from point 304 on the straight line segment, at the axis of symmetry 302. When the loop of magnet track 130 is farthest from the lower perimeter 34 of the water chamber 30 in the withdrawn or IN position, the instantaneous center of the circularly rotational motion is at point 308, which is 1.68 inches inside the closed curve 300 from point 304. The "stroke," or distance between points 306 and 308, is 1.23 inches. The phase of the circularly rotational motion with respect to the radially oscillatory motion may be any desired relationship, although suitably selected out-of-phase relationships tend to avoid the frequency and magnitude of magnetic flux nulls and peaks that might otherwise arise due to the periodicity of the motion. The annular velocity of the magnet track 130 ranges from about 20 to 60 revolutions/minute, although other annular velocities are suitable as well.

Other mechanisms may be used to achieve the radially oscillatory motion and the circularly rotational motion, including pivoting mechanisms which impart a motion that can be resolved into radially oscillatory motion and circularly rotational motion components, but that cannot uniquely be associated with individual mechanisms. Moreover, while the mechanism shown in the embodiment of FIG. 1 is mechanical, the "mechanism" may be implemented in other ways, including hydraulic and electro-mechanical implementations.

Other forms of closed curves on which magnet tracks may be based are obtained from a combination of two or more heart-shaped curves similar to curve 300. For example, FIG. 8B shows an alternative magnet track shape 320 that is based on the combination of two heart-shaped closed curves, curve 12 and curve 314. The lower left and lower right portions of closed curve 320 were derived from equation (1), as is apparent from superimposed curve 312. To define the lower left portion of closed curve 320° C. was set to 90 degrees and Theta was turned from about 26 degrees to 180 degrees. To define the lower right portion of closed curve 320° C. was set to 90 degrees, Theta was turned from about 52 degrees to 180 degrees, and the resulting curve was reflected across the axis 322. A scaling factor of 1.11 inches was applied to the equation-derived lower portions of curve 320. The upper left and right portions of closed curve 320 also were derived from equation (1), as is apparent from superimposed curve 314. To define the upper right portion of closed curve 320° C. was set to 270 degrees and Theta was turned from about one hundred forty-five to one hundred eighty degrees. To define the upper left portion of closed curve 320° C. was set to 270 degrees, Theta was turned from about one hundred forty-five to one hundred eighty degrees, and the resulting curve was reflected across the axis 322. A scaling factor of 1.41 inches was applied to the equation-derived upper portions of curve 320. Smooth connective segments interconnect the upper and lower portions of curve 320 derived from equation (1).

A magnet track based on curve 320 is constructed in a manner substantially similar to the magnetic track 130, using magnets of about the same width suitably segmented and shaped to accommodate the various portions of the closed curve 320, including the transition segments between the curves 312 and 314. An axis 322 actually represents two axes of symmetry of the closed curves 312 and 314, which are coincident because of the particular relationship between the closed curves 312 and 314 from which the closed curve 320 is derived. Such coincidence is not necessary in the derivation of a unitary closed curve from two or more heart-shaped closed curves, however. The instantaneous center of the circularly rotational motion of a magnet track based on curve 320 varies in accordance with the radially oscillatory motion. When the loop 324 of curve 320 is nearest the lower perimeter 34 of the water chamber 30 in the extended or OUT position, the instantaneous center of the circularly rotational motion relative to the curve 320 is at point 315, which corresponds to the center of the curve 314. When the loop of magnet track 130 is farthest from the lower perimeter 34 of the water chamber 3 in the withdrawn or IN position, the instantaneous center of the circularly rotational motion is at point 326, which is 1.23 inches along the axis 322 from point 315, toward loop 324. The "stroke," or distance between points 315 and 326, is 1.23 inches.

Cooling liquid 40 is introduced into the water chamber 30 through tubing 66 connecting to the internal passages of the rotating support/seal block 60 and passes into, through, and out of the drive shaft 140, through the tubing 148, and into the magnet housing cooling channel 136 from which the cooling liquid is distributed by uniformly spaced orifice water outlets 135 on the face of the magnet housing body 116 facing the backside of the target backing plate 20. Cooling liquid 40 is thereby routed and injected into the water chamber 30 at the space between the backside of the target backing plate 20 and the front face of the magnet housing assembly 110 through orifices disposed at 45° directed toward the location of the magnet track in a circular pattern having a diameter smaller than any portion of the magnet track 130 containing the magnets. The flow of the cooling liquid 40 past the back of the target backing plate 20 can cause turbulent flow along its surface, which will enhance the fluid's transfer of heat.

The magnetic field created by the magnets 121, ..., 125, concentrates the sputtering action and to a lesser extent the heat generated by that sputtering action in the target backing plate in the path of those magnets as they are moved. While the sputtering action is instantaneous and localized, causing localized hot spots on the target's surface, the heat the sputtering generates, as it is conducted through the target 10 and the target backing plate 20, is spread to an area much larger than those localized hot spots and reaches the back of the target backing plate 20 at a predetermined time after the magnets inducing sputtering have already moved to another location. Cooling liquid 40 is routed and directed toward the target backing plate 20 such that the cooling liquid with the lowest temperature is routed and directed at the back of the target backing plate 20 in an area where the backing plate's temperature would rise without this cooling.

The cooling system for this sputtering device provides that as the magnet housing assembly 110 containing the magnets 121, ..., 125, rotates and oscillates, cooling liquid injection nozzles 135 in the magnet housing assembly 110 also move and oscillate with the magnets. The cooling liquid thereby cools the back of the target backing plate 20 with a high efficiency by directing a stream of cooling liquid at a selected area of the back surface of the heated target backing plate 20. If cooling liquid were not directed at the back of the target backing plate 20 the plate's temperature would rise until the difference between the plate's temperature and its surrounding cooling fluid would be enough to generate natural convective fluid currents for heat transfer. However, as a result of the coldest cooling liquid being forcibly directed at a selected area on the back of the target backing plate 20 which is receiving thermal energy from the sputtering process, the cooling liquid forcibly flowing across the surface of the back of the target backing plate 20 provides high efficiency cooling and thereby immediately reduces the temperature of the target backing plate 20 to be in equilibrium with the temperature of the cooling liquid 40 in contact with it. In this embodiment, the water chamber 30 is oriented in such a fashion that the target 10 is horizontal facing down and the water chamber 30 is above it, as shown in FIG. 1, such that cooling liquid 40 being injected into the chamber 30, directed at the back of the target backing plate 20, fills up the water chamber 30, and with relatively little back pressure exits the water outlet fitting 31 on top of the water chamber 30.

The flow rate of cooling liquid 40 through the water chamber 30 as prescribed for this embodiment is 5-10 gallons per minute and the cooling nozzles 135 approximately 36 in number have a diameter of approximately 0.062 inches each. These cooling nozzles provide a very efficient heat transfer at the back of the copper target backing plate 20. The very efficient heat transfer at this copper-to-cooling liquid interface allows the sputter target to sustain high dissipated power densities for prolonged periods of time without excessive target temperatures. The injected cooling liquid 40 is forced to flow between the sweeping magnet housing assembly 110 and the copper target backing plate 20 which thereby provides increased heat transfer efficiency. The cooling liquid 40 (water or other) then fills a large low pressure (nearly no back pressure) liquid cavity behind the plate until it reaches its overflow (the water outlet fitting 31) from which it flows away.

A generalized cooling of the target backing plate 20 is provided once the cooling liquid 40 has exited the magnet housing assembly 110 and starts to mix with the mass of cooling liquid 40 in the water chamber 30 which is bathing the rotating mechanism 100.

In the present embodiment, about eighty percent of the sputter power of approximately 30 kilowatts is dissipated in target backing plate 20, which is 0.625 inches thick and 14.75 inches in diameter. Inlet cooling liquid pressure is approximately 40 psi. The target backing plate 20 is made of oxygen-free, high conductivity copper (OFHC).

As the target backing plate 20 is made from a simple flat plate and requires relatively little machining, conduction costs are relatively modest. The cost savings over time may be significant, as the target backing plate 20 is replaced each time the target thickness has been depleted to a point where a high probability of imminent target breakthrough exists.

FIG. 9 shows a close-up of the cooling channel 136 in the magnetic housing assembly 110, from the back of the assembly over the water inlet connecting hole 113, as seen in FIG. 1.

FIG. 10 is a cross section of FIG. 9 cut at 10—10. The diffusion ring 137 is supported by a fixing means 133 one of several connected to the magnetic housing over 115. In this embodiment the fixing means is a crew post. Circular slot gaps 134a and 134b of approximately 0.040 inches are provided between the edges of the diffusion ring 137 and the adjacent walls of the cooling channel 136.

FIG. 11 shows a cross section of FIG. 9 cut at 11—11. The magnet housing cover inlet water fitting 112 provides a flow path for cooling liquid 40 into the cooling channel top portion 138. The slots 134a, 134b prevent the cooling liquid from immediately flowing to the cooling channel bottom portion 139 and out the cooling nozzle 135y, during normal operation. The normal flow of cooling liquid is so high that it is restricted by the slots, so that the slots 134a and 134b act as orifices to regulate flow (and thereby pressure) from the cooling channel top portion 138 to the cooling channel bottom portion 139. These slots restrict the flow so that the pressure to the nozzle orifice 135y closest to water inlet fitting 112 will be nearly equal to the pressure at a nozzle most distant from the water inlet fitting 112. This will provide nearly equal flow rate and velocity through each of the equally sized orifices 135.

While our invention has been described with respect to the embodiments set forth above, our invention is not to be considered limited thereto. For example, while mechanisms for separately providing rotational and radial motions are illustrated, other mechanisms that may provide mixed rotational and radial motion are contemplated. The precise magnetic material and shape of the individual magnet segments of the magnet track are not critical, and other material and segment shapes are contemplated. Continuous unsegmented magnet material is contemplated as well. The ratio of the circular rotation and radial motion of the magnet track is not critical, and other ratios are contemplated. The design of the magnet track housing is not critical, and other designs are contemplated. Accordingly, these and other embodiments, variations and improvements not described herein are to be considered within the scope of our invention as defined by the following claims.

What is claimed is:

1. A coolable sputtering target plate assembly comprising:
   a walled cooling chamber;
   a target plate having a front side for receiving a sputtering target and a back side forming a portion of a wall of said cooling chamber;
   a rotatable drive shaft extending into said cooling chamber from outside said cooling chamber, said drive shaft having a hollow portion;

inlet means for routing in a sealed manner pressurized cooling liquid from an inlet connection to the hollow portion of said drive shaft through holes in said drive shaft, said inlet means being mounted on a wall of said cooling chamber and said drive shaft passing through and being rotatably supported by said inlet means;

outlet means coupled to an end of said drive shaft disposed in said cooling chamber for routing pressurized cooling liquid from the hollow portion of said drive shaft, said outlet means being operatively supported from said drive shaft; and a housing disposed within said cooling chamber and operatively coupled to said drive shaft for sweeping a planar surface thereof across the back side of said target plate, said housing comprising a cooling channel coupled to said outlet means for receiving pressurized cooling liquid from the hollow portion of said drive shaft, said housing having disposed therein a plurality of nozzles for directing a stream of cooling liquid from said channel to directly impinge on the back side of said target plate at various locations as said housing is swept;

wherein areas of the back side of said target plate most subject to heating by sputtering action on the sputtering target are impinged by cooling liquid over time.

2. An assembly as in claim 1, wherein said housing and said outlet means are rotatable with said drive shaft.

3. An assembly as in claim 1, further comprising a cooling chamber outlet fitting, wherein cooling liquid dispensed from said nozzles collects in said cooling chamber with a substantially minimal back pressure, and is conducted to said cooling chamber outlet fitting 4. An assembly as in claim 3, wherein said cooling chamber outlet fitting is disposed at a higher level in a gravitational field than said target plate.

5. An assembly as in claim 1, wherein said inlet mean comprises a rotary joint including a joint body having:

a cooling liquid receiving section at a longitudinal center of said body, the inlet connection of said inlet means opening into said cooling liquid receiving section;

a sealing section adjacent to each end of said cooling liquid receiving section; and a bearing section adjacent to each sealing section and opposite said cooling liquid receiving section.

6. An assembly as in claim 5, wherein said sealing section comprises a resilient ring having a "U"-shaped cross section disposed in a sealing channel surrounding said drive shaft with the open side of the "U"-shape facing said cooling liquid receiving section, wherein one side of said "U"-shaped section rests against a side of said drive shaft, wherein a second side of said "U"-shaped section rests against a side of said sealing channel, and wherein a bottom end of said "U"-shaped section rests against a sealing washer.

7. An assembly as in claim 5, wherein a portion of said drive shaft is enclosed by the cooling liquid receiving section and the sealing section of said rotary joint and includes cross drilled holes disposed therein or providing a passage for cooling liquid to flow from said cooling liquid receiving section of said rotary joint into the hollow portion of said drive shaft.

8. An assembly as in claim 1 wherein said outlet means comprises:

a drive shaft end block having an outlet connection; and a flexible tube having one end connected to the outlet connection of said drive shaft end clock and another end connected to said cooling channel.

9. An assembly as in claim 8, wherein said outlet mean is supported by said drive shaft in a manner such that said cooling channel can be oscillated with respect to said drive shaft, and wherein said flexible tube accommodates the oscillatory motion while maintaining a fluid connection between the outlet connection of said drive shaft end block and said water channel.

10. An assembly as in claim 1 wherein said cooling channel contains a diffusion ring which causes a cooling liquid pressure to be distributed around the cooling channel to equalize the pressure of a cooling liquid reaching said nozzles.

11. A magnet housing unit for sweeping behind the target support plate of a planar magnetron sputtering apparatus, comprising:

a supporting body having a surface thereof adapted for sweeping behind said target support plate;

a magnet track disposed in said supporting body;

a fluid line disposed in said support body for receiving pressurized cooling fluid;

a fluid channel provided in said supporting body, said fluid channel being connected to said fluid line; and a plurality of orifices from said channel to said supporting body sweeping surface for directly impinging said cooling fluid on said target support plate.

12. In a magnetron sputtering apparatus comprising a magnet assembly movable in a cooling chamber and a thermally conductive target plate having a front side and a back side, the front side of said target plate being adapted to receive a sputter target and the back side of said target plate forming a portion of a wall of said cooling chamber, wherein said cooling chamber contains cooling liquid and said magnet assembly is swept across the back side of said target plate, a method for cooling said a target plate comprising the steps of:

sweeping a body across the back side of said target plate in a coordination with said magnet assembly;

discharging cooling liquid from said body so as to directly impinge on the back side said target late at various locations as said body is swept; and draining cooling liquid from said cooling chamber;

wherein said sweeping step and said discharging step are coordinated so that areas of the back side of aid target plate most subject to heating by sputtering action on the sputtering target are impinged by cooling liquid over time.

13. A method as in claim 12 wherein said body comprises said magnet assembly.

14. A method as in claim 13, further comprising the step of providing cooling liquid under pressure to a cooling channel in said body, and wherein said discharging step comprises discharging cooling liquid from said cooling channel through a plurality of nozzles in said body.

15. A method as in claim 14 further comprising the steps of:

introducing as in claim 14 further comprising the steps of:

introducing a cooling liquid into said cooling channel at a predetermined inlet pressure, and uniformly distributing said inlet pressure throughout said cooling channel.

16. A method as in claim 12, wherein said draining step comprises draining cooling liquid from said cooling channel with negligible back pressure.

17. In a magnetron sputtering apparatus comprising a magnet assembly movable in a cooling chamber and a thermally conductive target late having a front side and a back side, the front side of said target late being adapted to receive a sputter target and the back side of said target plate forming a portion of a wall of said cooling chamber, wherein said cooling chamber contains cooling liquid and said magnet assembly is swept across the back side of said target plate, a method for cooling said target plate comprising the steps of:
 sweeping a surface of a body across the back side of said target plate in coordination with said magnet assembly, said surface being opposite the back side of said target plate and maintained parallel to and in proximity with the back side of said target late;
 discharging cooling liquid from si body directly into a volume between said surface and the back side of said target plate so as to cause turbulent flow of cooling liquid in said volume; and
 draining cooling liquid from said cooling chamber.

18. A method as in claim 17, wherein said body comprises said magnet assembly.

19. A method as in claim 18, further comprising the sep of providing cooling liquid under pressure to a cooling channel in said body, and wherein said discharging step comprises discharging cooling liquid from aid cooling channel through a plurality of nozzles in said surface.

20. A method as in claim 19 further comprising the steps of:
 introducing a cooling liquid into said cooling channel at a predetermined inlet pressure, and
 uniformly distributing said inlet pressure throughout said cooling channel.

21. A method as in claim 17, wherein said draining step comprises draining cooling liquid from said cooling channel with negligible back pressure.

22. A planar magnetron sputtering apparatus comprising:
 a cooling chamber;
 a thermally conductive target plate having a front side and a back side, the front side of said target plate being adapted to receive a sputter target and the back side of said target plate forming a portion of a wall of said cooling chamber;
 a magnet assembly mounted in said cooling chamber for sweeping a magnet across the back side of said target plate;
 a cooling assembly mounted in said cooling chamber for sweeping a body across the back side of said target plate in coordination with said magnet assembly, said body comprising ports directed towards and in proximity to the back side of said target plate for impinging streams of cooling liquid thereon at various locations as said body is swept; and
 a cooling chamber drain;
 wherein areas of the back side of said target plate most directly subject to heating by sputtering action on the sputtering target are impinged by cooling liquid over time.

23. An apparatus as in claim 22 wherein said magnet assembly and said cooling assembly are integrated, and wherein said body comprises said magnet.

24. An apparatus as in claim 23, further comprising:
 a cooling channel disposed in said body;
 a cooling channel inlet; and
 means for providing said cooling liquid under pressure to said cooling channel inlet; wherein said ports comprise a plurality of nozzles mounted in said body and connected to said cooling channel for discharging cooling liquid from said cooling channel.

25. An apparatus as in claim 24 wherein said cooling channel comprises a diffusion ring mounted therein, wherein said diffusion ring is disposed to intercept pressurized cooling liquid introduced through said cooling channel inlet and distribute said cooling liquid to said nozzles at a uniform pressure.

26. An apparatus as in claim 22 wherein said cooling chamber drain is a negligible back pressure drain.

27. A magnetron sputtering apparatus comprising:
 a cooling chamber;
 a thermally conductive target plate having a front side and a back side, the front side of said target plate being adapted to receive a sputter target and the back side of said target plate forming a portion of a wall of said cooling chamber;
 a magnet assembly mounted i said cooling chamber for sweeping a magnet across the back side of said target plate;
 a cooling assembly mounted in said cooling chamber for seeping a surface of a body across the back side of said target plate in coordination with said magnet assembly, said surface being opposite the back side of said target plate and maintained parallel to and in proximity with the back side of said target plate and comprising ports for introducing cooling liquid from said body directly into a volume between said surface and the back side of said target plate; and
 a cooling chamber drain.

28. An apparatus as in claim 27 wherein aid magnet assembly and said cooling assembly are integrated, and wherein said body comprises said magnet.

29. An apparatus as in claim 28, further comprising:
 a cooling channel disposed in said body;
 a cooling channel inlet; and
 means for providing said cooling liquid under pressure to said cooling channel inlet; wherein said ports comprise a plurality of nozzles in aid surface and connected to said cooling channel for discharging cooling liquid from said cooling channel.

30. An apparatus as in claim 29 wherein aid cooling channel comprising a diffusion ring mounted therein, wherein said diffusion ring is disposed to intercept pressurized cooling liquid introduced through said cooling channel inlet and distribute said cooling liquid to said nozzles a a uniform pressure.

31. An apparatus as in claim 27 wherein said cooling chamber drain is a negligible back pressure drain.

* * * * *

UNITED STATES PATENT AND TRADEMARK OFFICE
CERTIFICATE OF CORRECTION

PATENT NO. : 5,171,415

DATED : December 15, 1992

INVENTOR(S) : Kenneth C. Miller, et al.

Page 1 of 2

It is certified that errors appear in the above-identified patent and that said Letters Patent is hereby corrected as shown below:

```
Column 21 - line 38
Delete "mean" and substitute --means--

Column 22 - line 2
Delete "clock" and insert --block--

Column 22 - line 40
Delete "a"

Column 22 - line 42
Delete "late" and substitute --plate--

Column 22 - lines 60-61
Delete both lines

Column 23 - line 16
Delete "si" and substitute --said--

Column 23 - line 24
Delete "sep" and substitute --step--

Column 23 - line 27
Delete "aid" and substitute --said--

Column 24 - line 28
Delete "i" and substitute --in--

Column 24 - line 32
Delete "seeping" and substitute "sweeping"
```

UNITED STATES PATENT AND TRADEMARK OFFICE
CERTIFICATE OF CORRECTION

PATENT NO. : 5,171,415
DATED      : December 15, 1992
INVENTOR(S): Kenneth C. Miller, et. al.

It is certified that error appears in the above-indentified patent and that said Letters Patent is hereby corrected as shown below:

Column 24 - line 42
Delete "aid" and substitute --said--

Signed and Sealed this

Twenty-second Day of February, 1994

Attest:

BRUCE LEHMAN

Attesting Officer

Commissioner of Patents and Trademarks